(12) United States Patent  (10) Patent No.: US 8,132,930 B2
Wada  (45) Date of Patent: Mar. 13, 2012

(54) DISPLAY DEVICE FOR A TUNING APPARATUS

(75) Inventor: Norihiko Wada, Hamamatsu (JP)

(73) Assignee: Roland Corporation, Hamamatsu (JP)

( * ) Notice: Subject to any disclaimer, the term of this patent is extended or adjusted under 35 U.S.C. 154(b) by 348 days.

(21) Appl. No.: 12/572,162

(22) Filed: Oct. 1, 2009

(65) Prior Publication Data

US 2010/0195324 A1  Aug. 5, 2010

(30) Foreign Application Priority Data

Jan. 30, 2009 (JP) .................................. 2009-019378

(51) Int. Cl.
*H04M 1/22*  (2006.01)

(52) U.S. Cl. ................. 362/86; 362/27; 362/28; 362/29; 362/240; 362/249.02; 84/312 R

(58) Field of Classification Search .................... 362/23, 362/26–30, 86, 235, 240, 244, 249.02, 311.02, 362/559, 800; 84/312 R, 327, 329, 454–460; 984/260

See application file for complete search history.

(56) References Cited

FOREIGN PATENT DOCUMENTS

JP  2002-323893  11/2002

*Primary Examiner* — Jason Moon Han
(74) *Attorney, Agent, or Firm* — Foley & Lardner LLP

(57) ABSTRACT

A plurality of LEDs are arranged continuously in a row and a transparent LED cover is disposed over the front surface of the LEDs. The LED cover extends in the longitudinal direction of the arrangement of LEDs and is curved in an arc shape that is perpendicular to the longitudinal direction of arrangement of LEDs. The cover does not contain light diffusion material, but has a corrugated surface around the arc shape. The corrugated surface extends in the longitudinal direction of the arrangement of LEDs.

21 Claims, 7 Drawing Sheets

DISPLAY DEVICE FOR A TUNING APPARATUS

CROSS-REFERENCE TO RELATED PATENT APPLICATIONS

Japan Priority Application 2009-019378, filed Jan. 30, 2009 including the specification, drawings, claims and abstract, is incorporated herein by reference in its entirety.

FIELD OF THE INVENTION

The present invention relates to a display device for a tuning apparatus and a tuning apparatus having a display device, where the display device is an optical system that simulates a mechanical meter.

BACKGROUND

Prior displays for tuning apparatuses include displays such as disclosed in Japanese Laid-Open Patent Application Publication (Kokai) Number 2002-323893. In FIG. 3 and FIG. 4 of that publication, a tuning guide is configured with a plurality of indicators that are arranged in a row. The higher the pitch that the input musical tone signal is relative to a standard pitch, the further to the right of the center is the indicator that lights. Similarly, the lower the pitch that the input musical tone signal is relative to the standard pitch, the further to the left from the center is the indicator that lights.

With that apparatus, it is possible to carry out a display corresponding to that of a mechanical meter, but without the use of a mechanical meter. However, in an apparatus where LEDs are used as the indicators, if a diffusion material is added to the cover that is attached to each LED in order to diffuse the light, the visibility can become poor in bright locations where the lighting or sunlight strikes the LED. Therefore, LEDs that have a high degree of brightness have be employed as the indicators. On the other hand, in apparatuses in which the LED covers do not use a diffusion material to increase the visibility in bright locations, the light from the LEDs can have the appearance of point light sources, which degrades the appearance of the overall display as a line light source display that simulates a mechanical meter. In addition, in order to achieve a continuous line light source display using LEDs, the distance between adjacent LEDs has been made relatively short. Therefore, if a light isolation member is not arranged between adjacent LEDs, light leakage between adjacent LEDs is likely to occur.

SUMMARY OF THE DISCLOSURE

According to embodiments of the present invention, a display device for a tuning apparatus may be configured to increase the visibility and appearance qualities, even if highly bright LEDs are not used. Furthermore, embodiments of the present invention provide a visual appearance of a linear light source without requiring or using light isolation members.

A display device for a tuning apparatus according to an embodiment of the present invention has a group of point light source units arranged continuously in one row. It is preferable that the point light source units be arranged at a defined constant interval across the row and it is possible to use, for example, LEDs. However, in other embodiments, other suitable intervals (including non-constant intervals) and other suitable types of point light sources may be used. A transparent cover is disposed on the front surface of the light emitting sides of each of the point light source units. The cover extends in the longitudinal direction of the row of point light source units and is curved in an arc shape that is perpendicular to that longitudinal direction. The cover does not have a light diffusing material added; in other words, a light diffusing material is not included. The cover is formed with a corrugated surface that follows along the arc shape and the corrugated surface is arranged to extend in the along the longitudinal direction of the row of point light sources.

Since the cover does not contain a light diffusing material, the diffusion of the light in all directions through the cover is suppressed, and the diffusion of the light in the longitudinal direction of the arrangement of the point light source units is inhibited. Accordingly, in certain embodiments of the present invention, it is not necessary to dispose isolating members between adjacent point light source units. In addition, the light from the point light sources has the appearance of a linear shape in the direction that is perpendicular to the longitudinal direction in which the point light sources are arrayed, due to the corrugated surface that is formed on the cover. Thus, according to certain embodiments of the present invention, despite the fact that point light source units are used, the appearance that is exhibited is as a needle shaped display, appearing as if a single linear light source were used.

The shape of the corrugated surface of the cover may be configured such that the cover forms a plurality of isosceles triangle shapes at least within a specified range from the peak of the arc shape. The plurality of isosceles triangles are disposed such that a corresponding plurality of radii that extend radially from the center of the cover pass through the apices of the triangles. As a result, in the specified range from the peak of the arc shaped section, the light from the point light source units passes through each side of each isosceles triangle, roughly parallel to the radius. Accordingly, the light from each point light source has the appearance of a more linear form.

Alternatively or in addition, the shape of the corrugated surface of the cover may be configured such that, a plurality of triangles are formed at least within a specified range from the peak of the arc shape. Those triangles have sides that are approximately horizontal and approximately vertical. As a result, the portion of the light from each point light source that is oriented toward the roughly horizontal side is virtually completely reflected and there is no leakage through to outside the cover. In addition, the portion of the light from each point light source that is oriented toward the roughly vertical side passes through the roughly vertical side and is refracted such that the light approaches the vertical side. As a result, the light from the point light source has the appearance of a more linear form.

Furthermore, the shape of the corrugated surface of the cover can be configured such that the lengths of the approximately horizontal sides that are close to the peak of the arc shape are made short compared to the lengths of the approximately vertical sides. As a result, it is possible to make the light that is completely reflected by the approximately horizontal sides less and the light that passes through the approximately vertical sides greater. In that manner, it is possible to increase the amount of light that appears a linear form.

In the display device for a tuning apparatus of embodiments as described above, the surface of the side of the cover that faces the point light source units may be configured with an arc shaped cross section. As a result, the inside of the cover can be made hollow, for example to reduce the weight of the cover.

In addition, each of the point light source units may be positioned at the center of the arc shape of the cover. As a result, light from the point light source units may strike the arc shaped portion uniformly, such that the lengths of the linear form lights that are viewable through the cover have a more uniform appearance.

Thus, according to embodiments of the present invention, a linear form display may be provided that corresponds to the display of a mechanical meter while using an array of point light source units. Moreover, even when the point light source units are arranged in relatively close proximity to each other, it is possible to readily visually determine which of the point light source units emits light, where the emitted light appears in a linear form without blurring of the linear form display. In addition, it is possible to simplify the configuration without the need to dispose isolation members between adjacent point light source units.

DETAILED DESCRIPTION

Figure 1:
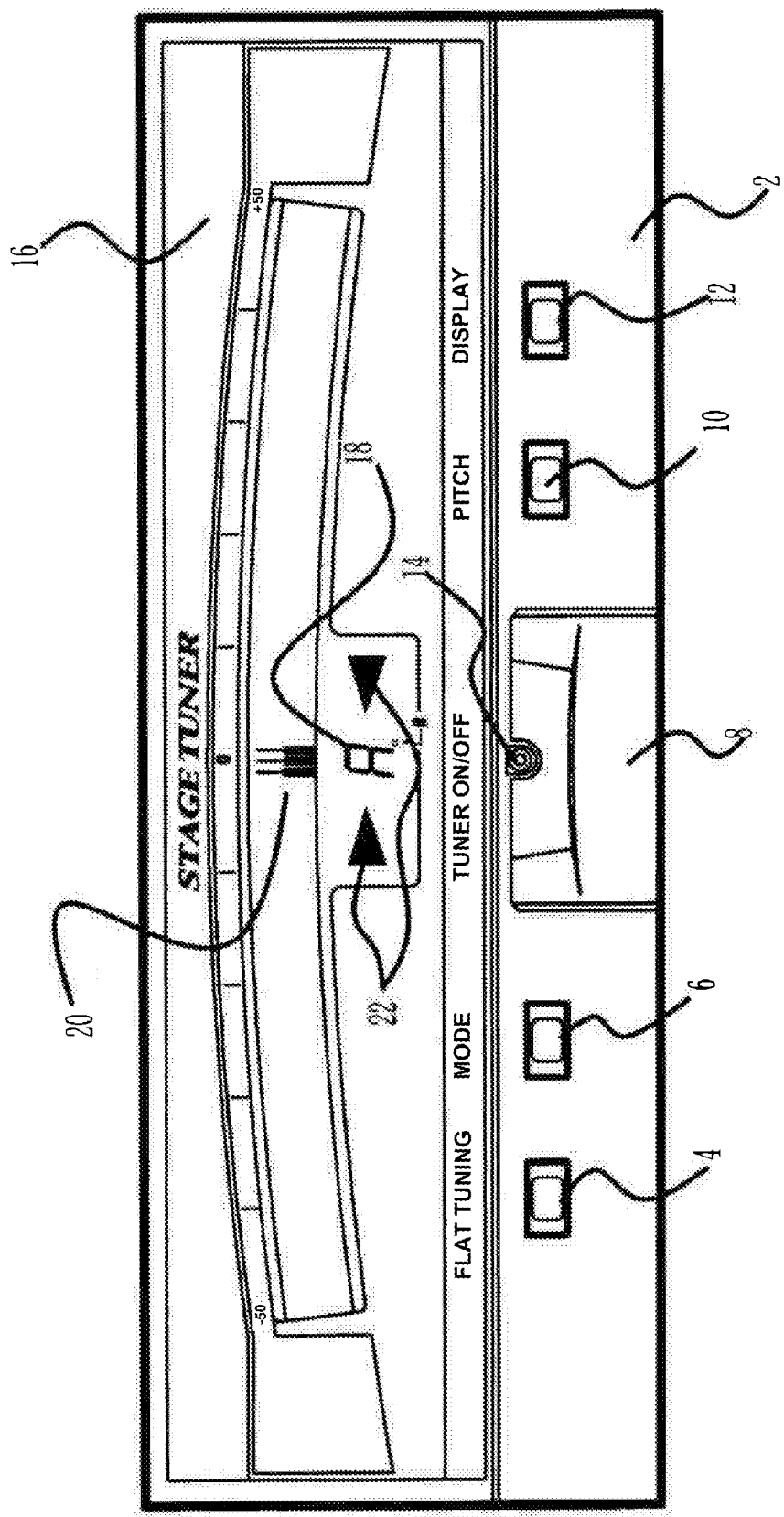
FIG. 1 is a plane drawing of a tuning apparatus according to an embodiment of the present invention.
Figure 2:
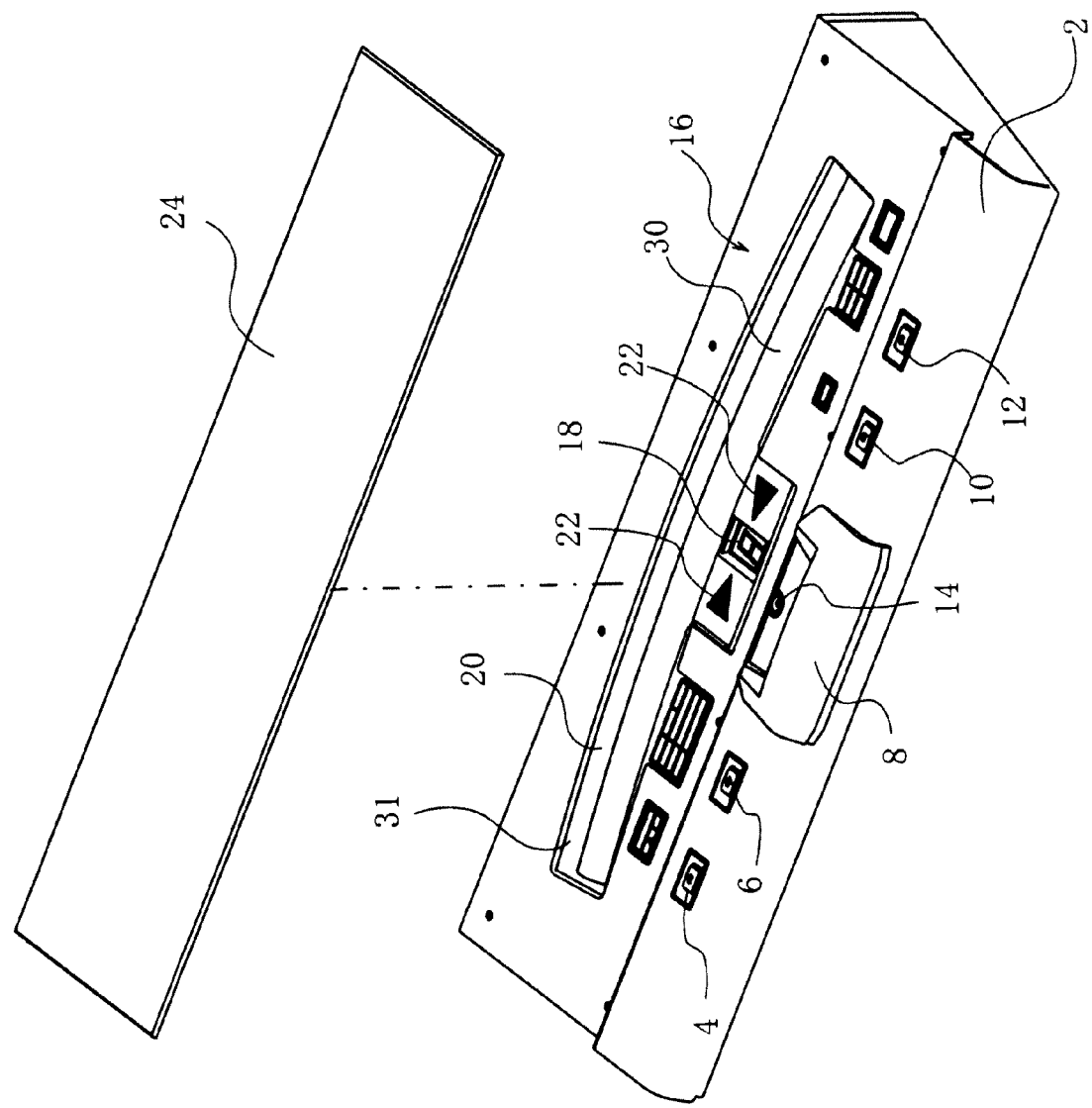
FIG. 2 is a partially exploded assembly drawing of the tuning apparatus of FIG. 1.

The tuning apparatus according to one embodiment of the present invention is for tuning of an electronic stringed instrument and is shown in FIG. 1 and FIG. 2. The tuning apparatus has a main body section 2 that has a longitudinal dimension in the horizontal direction of FIG. 1. The tuning apparatus may be placed at or near the feet of the instrument operator in a position to allow the operator to visually confirm the state of the tuning from the apparatus. A flat tuning button 4, a mode button 6, a tuner on/off switch 8, a pitch button 10, and a display button 12 are arranged in a row, in that order, at the front (lower portion in FIG. 1) of a top surface of the main body section 2. The tuning on/off indicator 14 is disposed next to the tuner on/off switch 8. The display section 16 is disposed in a position at the back (upper portion in FIG. 1) of the top surface of the main body section 2.

An electronic string instrument to be tuned may be connected to an input jack (not show) on the tuning apparatus and the mode button 6 may be pushed and the tuning mode selected. For the tuning modes there are for example, the Chromatic mode that tunes the musical intervals of all 12 tones in half tone steps, the Guitar mode that does the tuning with the guitar string numbers, the Bass mode that does the tuning with the bass string numbers, the Drop D mode that does drop D tuning of the guitar, and the DADGAD mode that does DADGAD tuning of the guitar. The tuner on/off switch 8 is operated to turn the tuning apparatus on. When the tuning apparatus is turned on, the tuner on/off indicator 14 lights. In this state, a single tone may be generated by the electronic stringed instrument. Then the string number that is close to the single tone that has been generated is displayed on the note name and string number indicator 18 of the display section 16. The divergence from the correct tone interval is displayed by the meter 20 and the tuning guide indicator 22 of the display section 16. The meter 20 is an electronic meter, but is configured such that a linear dimension and form of the display resembles the display of a mechanical type needle. In those cases where the tone interval is low, the linear display indicator is further to the left than the middle of the meter 20; and in those cases where the tone interval is high, the linear display indicator is further to the right than the middle of the meter 20. In those cases where the tone intervals are in agreement, the display of the linear display indicator is in the middle of the meter 20. Thus, the left side of the tuning guide indicator 22 in FIG. 1 lights in those cases where the tone interval is low, while the right side lights in those cases where the tone interval is high, and both light when the tone intervals match. The tuning apparatus may have various functions in addition to those described herein.

FIG. 2 shows the tuning apparatus in a the state in which the upper cover 24, which covers the display 16, and the button cover portion (not shown in FIG. 2) which covers the flat tuning button 4, the mode button 6, the pitch button 10, and the display button 12, have been removed. The upper cover 24 may be made of any suitable material, including, but not limited to a translucent material such as, but not limited to acrylic that has been colored at appropriate locations. As is shown in FIG. 2, the upper cover 24 is attached on the main body unit 2 over and covering the note name and string number indicator 18, the meter 20, and the tuning guide indicator 22. In addition, each of the switches, the flat tuning button 4, the mode button 6, the pitch button 10, and the display button 12 has an LED that shows the operating state of the display button built into the main body section 2.

Figure 3:
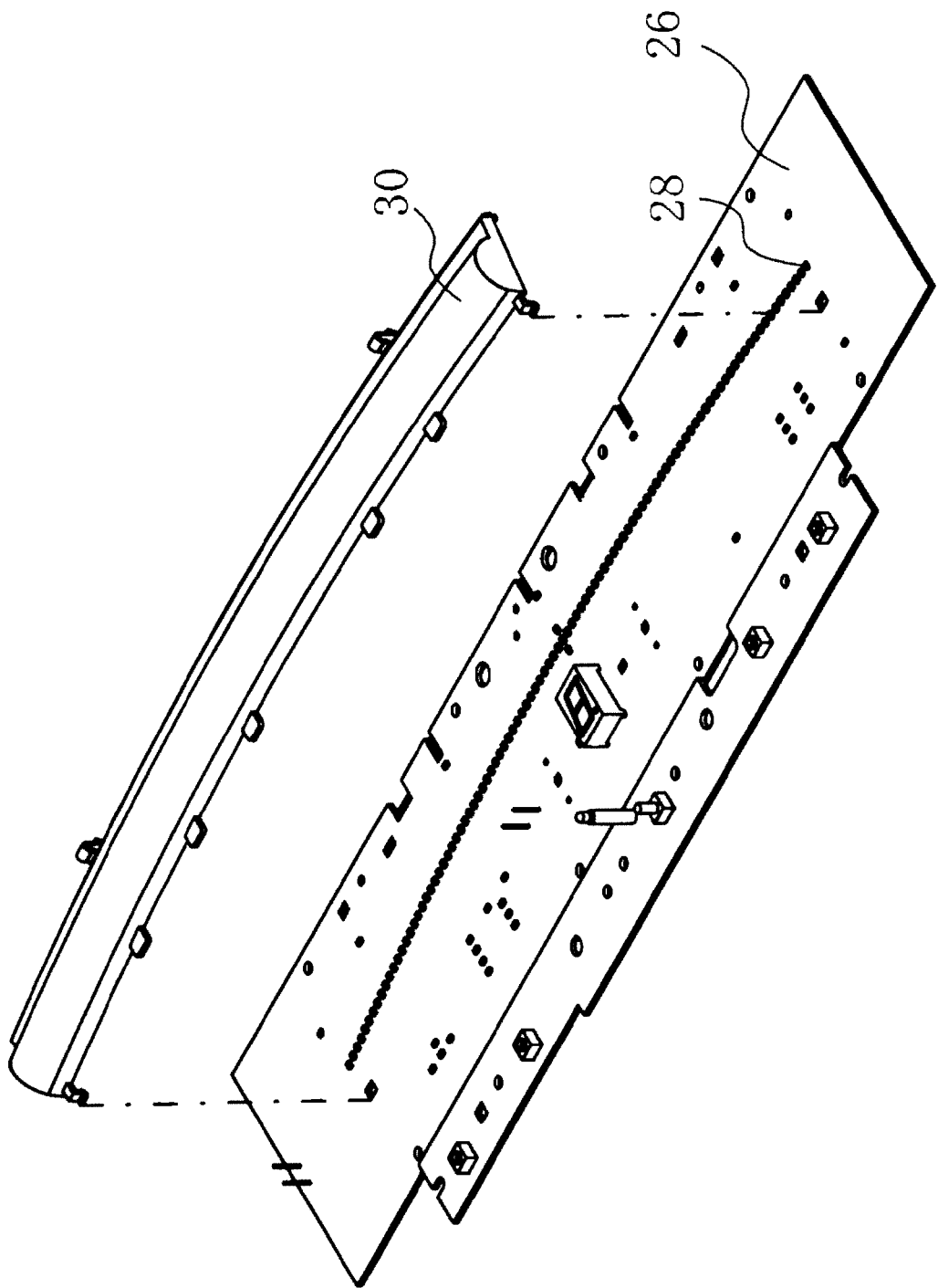
FIG. 3 is a partially exploded assembly drawing of a display section for the tuning apparatus of FIG. 1.
Figure 4:
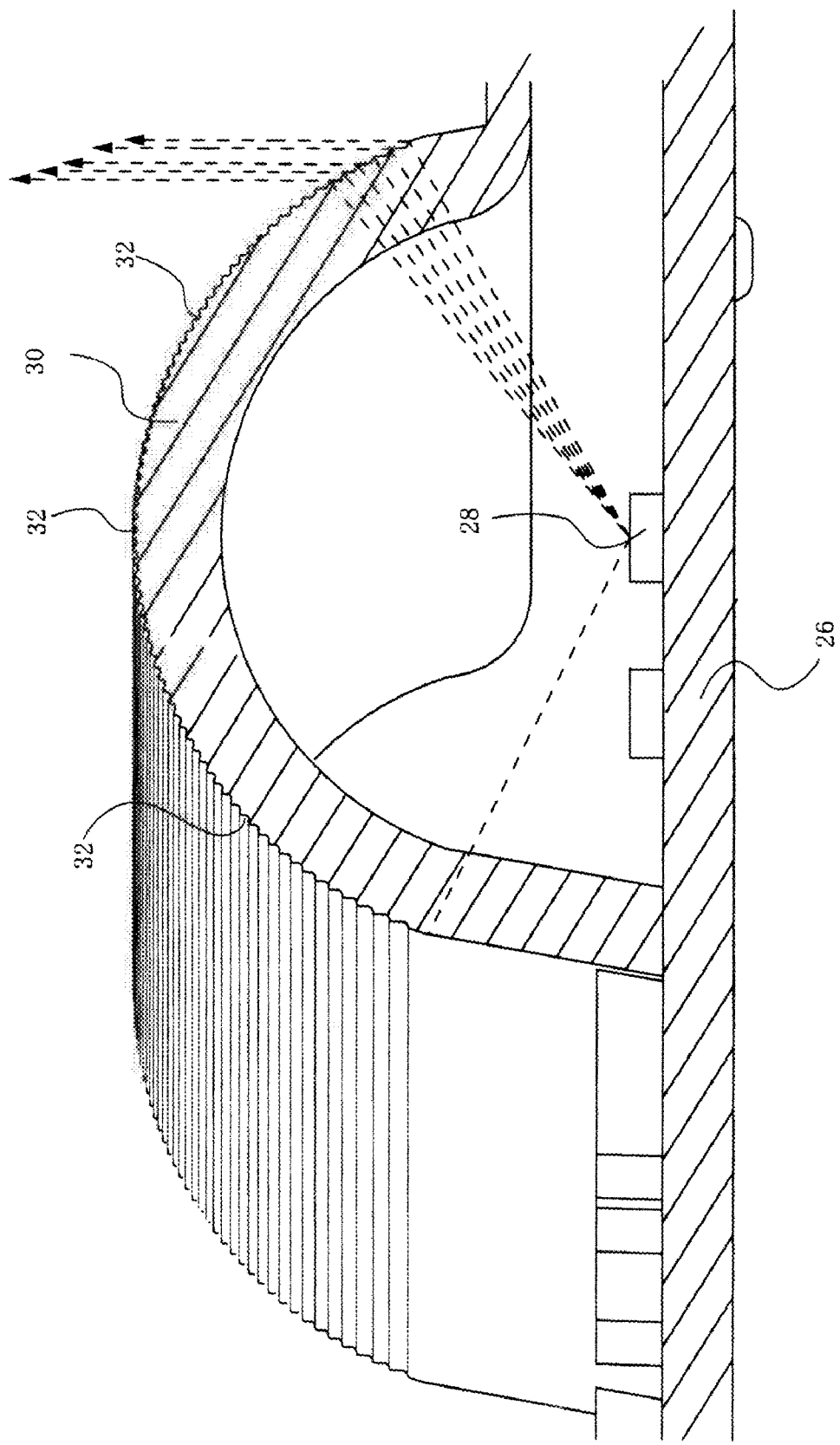
FIG. 4 is a drawing showing a partial perspective and expanded view of the display section of FIG. 3.
Figure 5:
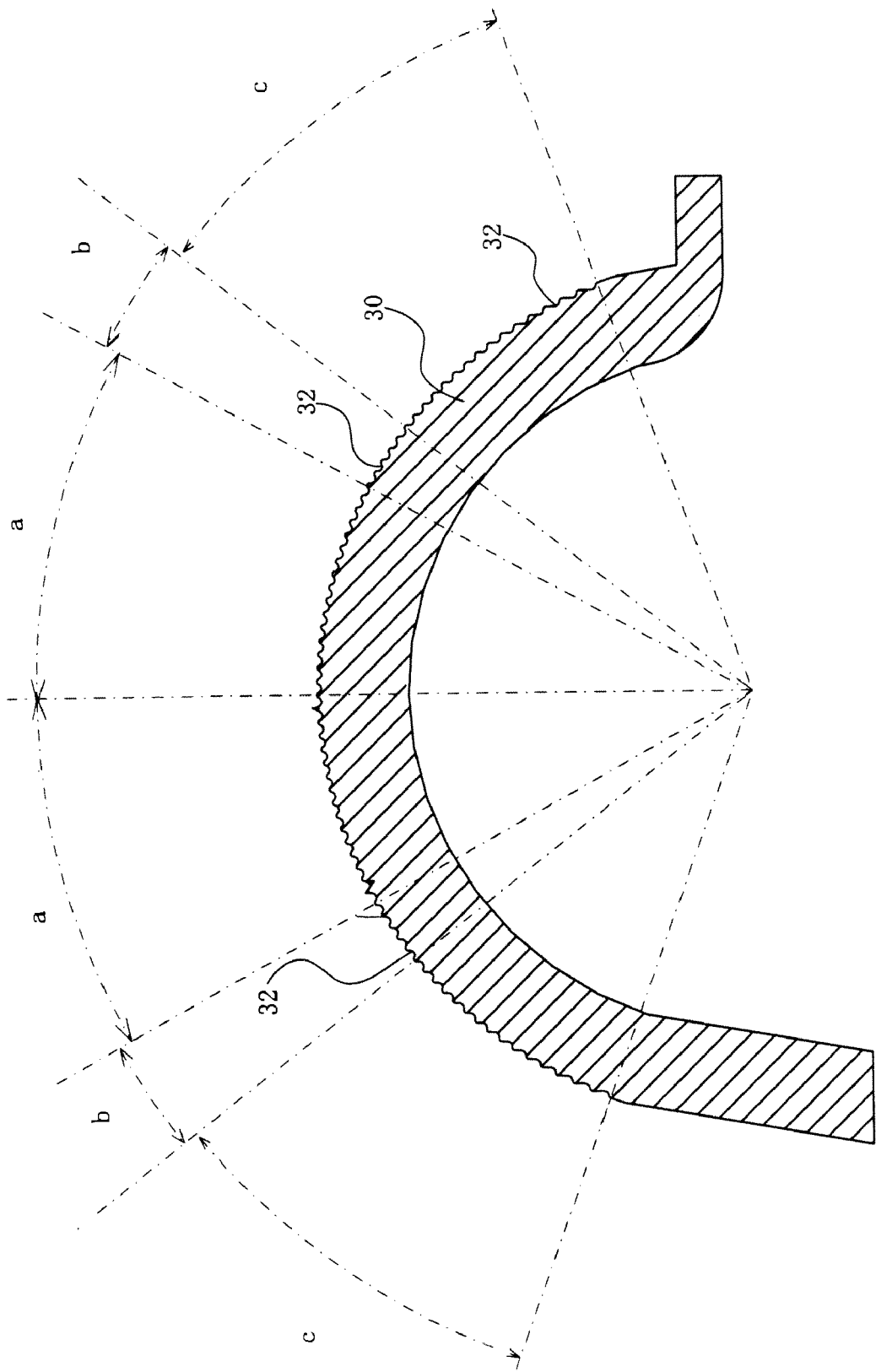
FIG. 5 is a longitudinal section lateral drawing of an LED cover for the display section of FIG. 3.

As is shown in FIG. 3, the display section 16 has a point light source unit group, for example but not limited to an LED group, with a plurality of point light source units, for example but not limited to a total of 101 LED elements 28 disposed in a row at a specified spacing interval (for example, but not limited to 3.08 mm). In the embodiment of FIG. 3, a plurality of LED point light source units 28 are disposed on one side of a rectangular printed circuit board 26. These LEDs 28 may be chip LEDs in which the light emitting section is a point light emitter and, in the FIG. 3 embodiment, are arranged in a line that forms an arc shape. A cover, for example, the LED cover 30, that covers all of the LEDs 28 is attached to the printed circuit board 26 over and in front of the light emitting side of the LEDs 28. The LED cover 30 may be made of any suitable material including, but not limited to a synthetic resin, that does not have a light diffusion material added. Thus, the LED cover 30 does not contain (is free of) a light diffusion material. For example, a suitable synthetic resin may be a material that is uncolored and transparent, through which light is transmitted such as, for example but not limited to ABS. The LED cover 30 is formed in an arc shape along its longitudinal dimension, corresponding to and matching the arc-shaped line of the LEDs 28. The side shape of the LED cover 30, as is shown in FIG. 4 and FIG. 5, forms an arc, for example but not limited to the arc of approximately a semicircle. The inside of the LED cover 30 is hollow and the center of the semicircle is, as is shown in FIG. 4, positioned above the center of each of the LEDs 28.

Although this is not shown in FIG. 3, the note name and string number indicator 18 and the tuning guide indicator 22 also may be attached to the printed circuit board 26. As is shown in FIG. 2, the printed circuit board 26 is arranged in the main body section 2 so that the LED cover 30 is positioned in a window 31 on the top surface of the main body section 2.

As is shown in FIG. 4, a plurality of corrugations 32 are formed on the outer surface of the LED cover 30, around the semicircle arc. The corrugation 32 extends from one edge of the LED cover 30 to the other edge, along the longitudinal dimension of the cover 30. The corrugation 32 is arranged continuously, with the shape of their side surfaces forming generally triangular shaped portions (in cross section or side view of FIG. 5) having their apices protruding outward from the outer surface of the LED cover 30. The apices of the generally triangular shaped portions of the corrugation 32 and the junctions of the adjacent generally triangular shapes on the outer surface side of the LED cover 30 may be rounded as shown in FIGS. 4 and 5.

In certain embodiments as shown in FIG. 5, the generally triangular shapes of the corrugation 32 are configured with the substantially equal side lengths for each side that is connected to the apices. Moreover, the generally triangular shapes may be disposed at an equal pitch in the region "a" in a specified angular range on both sides of a perpendicular line "l" extending from the center of the LED cover 30. In one example embodiment, the generally triangular shapes are arranged at a pitch of 0.3 mm. However, further embodiments may include generally triangular shapes that are arranged at a pitch of from about 0.25 to about 0.5 mm. The sides of the generally triangular shapes in the corrugation that are at the two opposite ends of the region "a" (the position in region "a" that is the most distant from the perpendicular line "l") are generally parallel and, for example, are at angle that is slightly greater than one degree with respect to perpendicular line "l".

In the region "b" that is adjacent to the region "a" and separated from the perpendicular line "l" by the region "a," the lengths of the two sides of each of the generally triangular shapes in the corrugation are about equal. Also, in region "b," the side of each generally triangular shape that is more distant from the perpendicular line "l" is generally vertical and is arranged at a generally equal pitch with the corresponding side of each of the other generally triangular shaped portions in region "b.". In one example embodiment, the pitch in region "b" may be about the same as the pitch of the region "a," so that an angle of, for example, one degree is made by the generally vertical side of each generally triangular shaped portion in region "b" with respect to the perpendicular line "l." In addition, the generally vertical side of each generally triangular shape in region "b" is not as long as the corresponding sides of the generally triangular shapes in region c, discussed below, but is longer than the other side of the generally triangular shape in region "c." The position of the end of the region "b" (the position in region "b" that is most distant from the perpendicular line "l") is set so that the lengths of the two sides of the generally triangular shape at that position are about equal and, at the same time, is a position where it becomes nearly impossible for the side most distant from the perpendicular line "l" to be vertical.

In the region "c," which is adjacent to the region "b" and more distant from the perpendicular line "l" than "b," the lengths of the two sides of each of the generally triangular shapes in the corrugation 32 are different, where the side that is more distant from the perpendicular line "l" is generally vertical. Also, the pitch of the sides furthest from the perpendicular line "l" of the generally triangular shapes in region "c" is different than the pitch in region "b," such that, for example, an angle of one degree with respect to the perpendicular line "l" is made. In addition, that side is set longer than the other side of each triangular shape in region "c." Also, the pitch is set such that as there is a progression in the distance from the perpendicular line "l," there is a gradual increase in the pitch even more than in the regions "a" and "b." Accordingly, the generally triangular shapes in the region "c" each comprise a long side that is positioned about vertical and a short side that is positioned about horizontal.

Figure 6A:
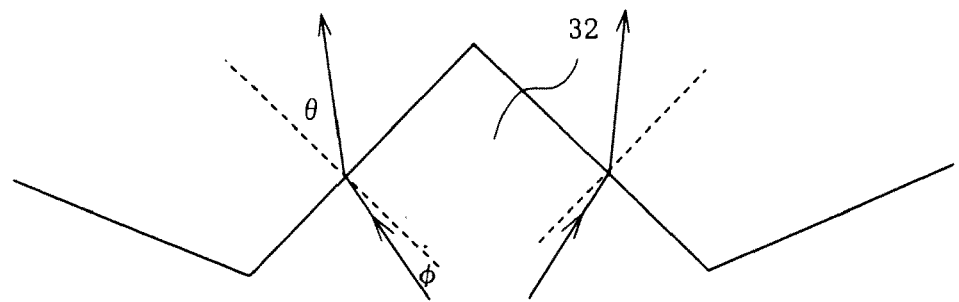
FIGS. 6a-c are drawings for an explanation of refraction of the light in the LED cover of FIG. 5.
Figure 6B:
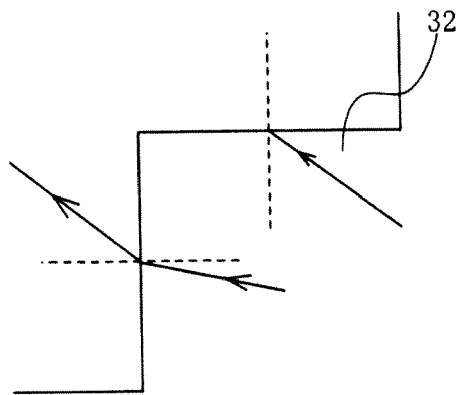
Figure 6C:
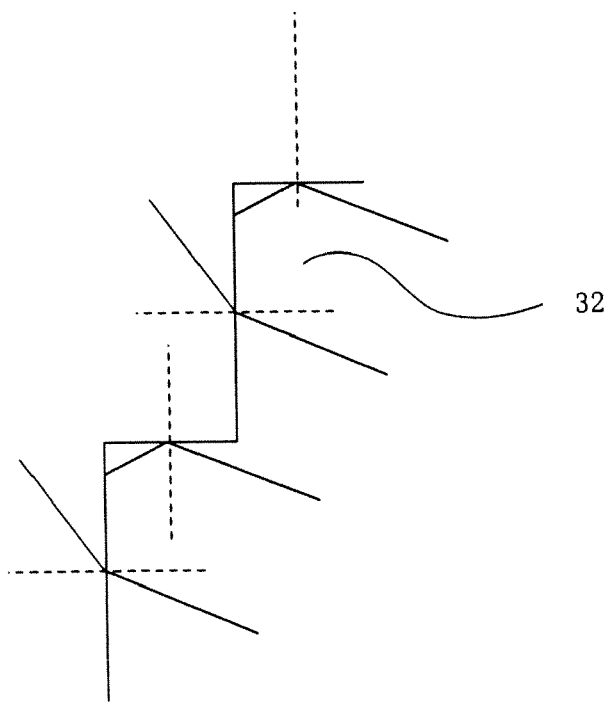
Figure 7A:
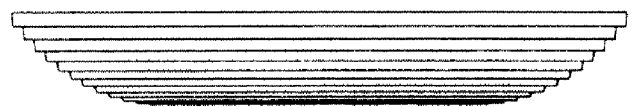
FIGS. 7a-d show a front view drawing, a plane drawing, a bottom view drawing, and a left lateral drawing, respectively, of another example of an LED cover of FIG. 5.
Figure 7B:
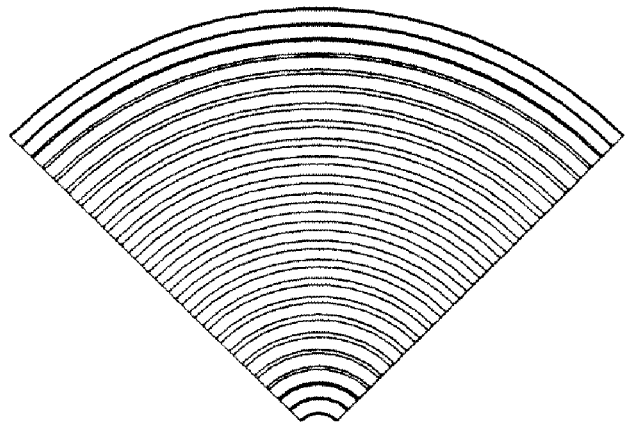
Figure 7C:
Figure 7D:

Since the corrugations 32 of each of the regions "a," "b," and "c" are configured in this manner, the corrugation 32 of the region "a" can be made, as is shown in FIG. 6(a), to have a lateral shape that closely approximates the lateral shape of a plurality of isosceles triangles that extend continuously on the outer surface of the LED cover 30. In addition, the corrugations 32 of the region "b" can be made, as is shown in FIG. 6(b), to closely approximate a pluralities of isosceles triangle that are each positioned with one side about vertical. Also, the corrugations of the region "c" can be made, as is shown in FIG. 6(c), to closely approximate a plurality of triangles, each having a longer side that is positioned about vertical and a shorter side that is positioned about horizontal.

With the meter 20 configured as described above, when any one of each of the LEDs 28 emits light, the light is radiated in various directions. Within the LED cover 30, the portion of the light that has impacted directly on the inner surface of the LED cover 30 in region "a" is beamed, as is shown in FIG. 6(a), toward the two sides of the generally triangular shapes in the corrugation 32. In general, since the index of refraction of the LED cover 30 is greater than the index of refraction of air, the angle of refraction θ of the light that is emitted into the air from the LED cover 30 is greater than the angle of incidence φ. Accordingly, the portion of the light that is incident on the region "a" is beamed generally upward.

Of the portion of the light that is beamed toward the region "b," as is shown in FIG. 6(b), there is some that is beamed toward the generally horizontal sides of the corrugation 32 and some that is beamed toward the generally vertical sides of the corrugation 32. The majority of the portion that is beamed toward the horizontal sided is virtually completely reflected and virtually none is beamed upward. On the other hand, since the angle of refraction of the portion of the light that is beamed toward the roughly vertical sides is greater than the angle of incidence, that portion of the light is beamed upward.

In region "c," in the same manner as in the region "b," the light that has been beamed toward the generally vertical sides is refracted and beamed upward. In addition, since the length of the generally horizontal sides is relatively short, the amount of light that is completely reflected by the roughly horizontal sides is relatively low and, overall, the light that is refracted by the roughly vertical sides and beamed upward is relatively great.

In addition, a portion of the light emitted from the LEDs 29 is also beamed toward and along the longitudinal dimension direction of the LED cover 30. However, most of that light is completely reflected, the amount of light that is incident into the LED cover 30 can be relatively small. Moreover, since no diffusion material is contained in the LED cover 30, there is not much diffusion of the light that is incident on the LED cover 30.

When a single LED 28 emits light, the light that is viewable through the LED cover 30 appears in a form of a line that is perpendicular to the long direction of the LED cover 30 with preferred visibility when the tuning apparatus is viewed from above. Accordingly, by changing the LEDs 28 with which light is emitted in a consecutive order, it is possible to simulate a condition in which the needle of a mechanical meter moves.

In the preferred embodiment described above, the corrugation 32 is respectively different in the respective regions "a," "b," and "c." However, in further embodiments, the lateral shape of the LED cover 30 may be configured with an arc that is smaller than a semicircle, for only the region "a." In addition, in the embodiments described above, the LED cover 30 has a shape that forms an arc that extends along the longitudinal dimension direction of the cover. However, in other embodiments, the cover is not limited to that configuration; and, for example, as is shown in FIG. 7(a) through (d), the cover 30 may be configured such that the planar form is a fan shape and the two sides form arcs, and such that the height measurements gradually become greater from the point end (pivot) of the fan up the mid-point toward the outer edge of the arc, in the radial direction. In that embodiment, the LEDs may be arranged in an arc that is concentric with the outer edge section from the pivot up to the mid-point toward the outer edge section.

In addition, while in the embodiments described above, the corrugation 32 is disposed on the outside of the LED cover 30, in other embodiments, the corrugation 32 may be disposed on the inside of the LED cover 30 in addition to the outside of the cover. Furthermore, such embodiments may be configured so that the outside of the cover 30 forms a flat semicircle lateral cross sectional shape. In that embodiment, the amount of light that is viewable as a linear form is different from that of the previously described embodiments, and most of the light is transmitted in the horizontal direction such that a smaller amount of light is transmitted in the perpendicular direction. As a result, the device becomes one that is readily visible from both the front and back of the tuning apparatus.

While embodiments described above employ LEDs as point light sources, other embodiments may employ other suitable point light source devices. Also, while embodiments described above employ a defined number (101) of LEDs in a line that forms an arc shape, other embodiments may employ any other suitable number of point light sources in an arc shaped line or in a straight line or other suitable arrangement. In the above description, references to horizontal and vertical directions are made with respect to the upward-facing surface of the printed circuit board 26.

What is claimed is:

1. A display device for a musical tuning apparatus, the display device comprising:
   a point light source unit group including a plurality of point light source units arranged in a row along a longitudinal direction for displaying a meter of the tuning apparatus, each point light source unit having a light emitting side, and
   a generally transparent cover disposed over the light emitting side of the point light source units and extending in the longitudinal direction of the arrangement of point light source units, the generally transparent cover having a shape that is curved in an arc extending generally perpendicular to the longitudinal direction, and
   the cover being made of a material that is free of added light diffusion material and the cover having a corrugated surface around the arc shape of the cover, where the corrugated surface has corrugations that extend in the longitudinal direction of the arrangement of point light source units.

2. A display device as recited in claim 1, wherein the arc shape of the cover has a peak and the corrugated surface of the cover, at least within a specified range from the peak of the arc shape, has a lateral cross-section shape that includes a plurality of isosceles triangular shapes arranged such that a plurality of radii that extend radially from a center of the cover pass through apices of the triangular shapes.

3. A display device as recited in claim 1, wherein the arc shape of the cover has a peak and the corrugated surface of the cover, at least within a specified range from the peak of the arc shape, has a lateral cross-section shape that includes a plurality of generally triangular shapes, wherein each generally triangular shape has generally horizontal side and a generally vertical side.

4. A display device as recited in claim 3, wherein each generally horizontal side and each generally vertical side of each generally triangular shape has a length dimension that the length dimension of each generally horizontal side is shorter than the length dimension of the generally vertical side of the triangular shape.

5. A display device as recited in claim 1, the cover having a surface that faces opposite to the corrugated surface and that has an arc shaped cross section.

6. A display device as recited in claim 1, where each of the point light source units is located at a position that is centered relative to the arc shape of the cover.

7. A display device as recited in claim 2, where each of the point light source units is located at a position that is centered relative to the arc shape of the cover.

8. A display device as recited in claim 3, where each of the point light source units is located at a position that is centered relative to the arc shape of the cover.

9. A display device as recited in claim 4, where each of the point light source units is located at a position that is centered relative to the arc shape of the cover.

10. A display device as recited in claim 5, where each of the point light source units is located at a position that is centered relative to the arc shape of the cover.

11. A display device for a musical tuning apparatus, the display device comprising:
    a plurality of point light source units arranged in a row having a longitudinal dimension for displaying a meter of the tuning apparatus; and
    a cover disposed over the point light source units and extending in the longitudinal dimension of the row of point light source units, the cover having a cross-section shape at a cross section taken transverse to the longitudinal dimension of the row of point light source units, where the cross-section shape comprises an arc shape, the arc shape having a arc peak;
    wherein the cover has a corrugated surface that has a cross-section shape at said cross section, the cross-section shape of the corrugated surface having a plurality of generally triangular shaped portions arranged at least within a defined range from the arc peak and extending at least partially along the arc shape.

12. A display device as recited in claim 11, wherein each of the generally triangular shaped portions is an isosceles triangular shaped portion.

13. A display device as recited in claim 11, wherein each of the generally triangular shaped portions having an apex at a location in linear alignment with a central location under the cover at which any one of the point light source unit is arranged.

14. A display device as recited in claim 11, wherein the cover is made of a material that is free of added light diffusion material.

15. A display device as recited in claim 11, wherein each of the generally triangular shaped portions of the corrugated surface having a first triangle side and a second triangle side, the first and second triangle sides extending along the cover in the longitudinal dimension at least along the full row of point light source units.

16. A display device as recited in claim 11, wherein each of the generally triangular shaped portions of the corrugated surface having a first triangle side and a second triangle side, the first and second triangle sides extending along the cover in the longitudinal dimension continuously at least from one end of the row of point light source units to an opposite end of the row of point light source units.

17. A display device as recited in claim 11, wherein each of the generally triangular shaped portions of the corrugated surface having a first triangle side and a second triangle side and wherein, within a first range (a) from each side of the arc peak, the first triangle side and the second triangle side of each generally triangular shaped portion are approximately equal in length.

18. A display device as recited in claim 17, wherein within the first range (a) from each side of the arc peak, the generally triangular shaped portions are arranged at a generally constant pitch.

19. A display device as recited in claim 17, wherein the plurality of point light source units are arranged on a board having a surface extending in a plane, and wherein beyond the first range (a) but within a specified second range (b) from each side of the arc peak, the first triangle side and the second triangle side of each generally triangular shaped portion are approximately equal in length, and the second triangle side of each generally triangular shaped portion extends substantially perpendicular to the surface of the board.

20. A display device as recited in claim 19, wherein beyond the second range (b) but within a specified third range (c) from each side of the arc peak, the second triangle side of each generally triangular shaped portion is longer than the first triangle side of the same generally triangular shaped portion, and the second triangle side of each generally triangular shaped portion extends substantially perpendicular to the surface of the board.

21. A display device as recited in claim 20, wherein the first triangle side of each generally triangular shaped portion beyond the second range (b) but within the third range (c) is substantially parallel to the surface of the board.

\* \* \* \* \*